(12) United States Patent
Fan et al.

(10) Patent No.: US 9,673,338 B2
(45) Date of Patent: Jun. 6, 2017

(54) NON-VOLATILE MEMORY UNIT AND METHOD FOR MANUFACTURING THE SAME

(71) Applicant: Xinnova Technology Limited, Beijing (CN)

(72) Inventors: Der-Tsyr Fan, Taoyuan County (TW); Chih-Ming Chen, Hsin-chu (TW); Jung-Chang Lu, Hsin-chu (TW)

(73) Assignee: XINNOVA TECHNOLOGY LIMITED, Beijing (CN)

(*) Notice: Subject to any disclaimer, the term of this patent is extended or adjusted under 35 U.S.C. 154(b) by 0 days.

(21) Appl. No.: 14/994,719

(22) Filed: Jan. 13, 2016

(65) Prior Publication Data
US 2016/0204273 A1    Jul. 14, 2016

Related U.S. Application Data

(60) Provisional application No. 62/102,639, filed on Jan. 13, 2015.

(51) Int. Cl.
| | | |
|---|---|---|
| H01L 29/788 | (2006.01) | |
| H01L 21/265 | (2006.01) | |
| H01L 21/28 | (2006.01) | |
| H01L 27/11521 | (2017.01) | |
| H01L 29/40 | (2006.01) | |
| H01L 29/423 | (2006.01) | |
| H01L 29/66 | (2006.01) | |
| H01L 21/02 | (2006.01) | |
| H01L 27/11524 | (2017.01) | |

(52) U.S. Cl.
CPC .... H01L 29/7883 (2013.01); H01L 21/26513 (2013.01); H01L 21/28273 (2013.01); H01L 27/11521 (2013.01); H01L 29/401 (2013.01); H01L 29/42328 (2013.01); H01L 29/66825 (2013.01); *H01L 21/02238* (2013.01); *H01L 27/11524* (2013.01)

(58) Field of Classification Search
CPC .......... H01L 29/7883; H01L 21/26513; H01L 21/28273; H01L 27/11521; H01L 29/401; H01L 29/42328; H01L 29/66825
See application file for complete search history.

(56) References Cited

U.S. PATENT DOCUMENTS

| | | | | |
|---|---|---|---|---|
| 6,893,921 | B2* | 5/2005 | Ding | ................ H01L 29/42324 257/296 |
| 7,053,438 | B2* | 5/2006 | Ding | .................... H01L 27/105 257/314 |
| 7,598,561 | B2* | 10/2009 | Chen | ................... H01L 29/7885 257/314 |
| 9,219,125 | B2* | 12/2015 | Chen | ...................... H01L 29/78 |
| 2004/0130947 | A1* | 7/2004 | Fan | .................... G11C 16/0433 365/185.05 |

(Continued)

*Primary Examiner* — Earl Taylor
(74) *Attorney, Agent, or Firm* — Chun-Ming Shih

(57) ABSTRACT

A non-volatile memory unit and method of manufacturing the same are disclosed. The non-volatile memory unit includes a substrate with a source region and a drain region. A first dielectric layer forms on the substrate. An erase gate, a floating gate and couple control gate are forms on the first dielectric layer. The second dielectric layer and coupled dielectric layer are formed among and above the erase gate, the floating gate and the selective gate, and formed on the couple control gate of the coupled dielectric layer.

22 Claims, 11 Drawing Sheets

(56) References Cited

U.S. PATENT DOCUMENTS

| | | | |
|---|---|---|---|
| 2005/0087892 A1* | 4/2005 | Hsu | H01L 27/11521 257/296 |
| 2005/0146937 A1* | 7/2005 | Fan | G11C 16/0433 365/185.17 |
| 2005/0207199 A1* | 9/2005 | Chen | G11C 16/0425 365/51 |
| 2009/0039410 A1* | 2/2009 | Liu | H01L 21/28273 257/320 |
| 2013/0234223 A1* | 9/2013 | Toren | H01L 21/28273 257/316 |
| 2014/0140138 A1* | 5/2014 | Tran | G11C 16/0483 365/185.18 |
| 2014/0183612 A1* | 7/2014 | Chen | H01L 27/11524 257/315 |
| 2014/0361358 A1* | 12/2014 | Chen | H01L 27/11524 257/315 |
| 2015/0008509 A1* | 1/2015 | Charpin-Nicolle | H01L 21/28282 257/326 |
| 2015/0214315 A1* | 7/2015 | Fan | H01L 27/11521 257/321 |
| 2015/0243795 A1* | 8/2015 | Fan | H01L 29/42328 257/321 |
| 2015/0263010 A1* | 9/2015 | Chuang | H01L 27/11534 257/319 |
| 2016/0104711 A1* | 4/2016 | Hsu | G11C 16/14 257/300 |
| 2016/0204272 A1* | 7/2016 | Fan | H01L 29/66825 257/319 |
| 2016/0204273 A1* | 7/2016 | Fan | H01L 29/66825 257/319 |
| 2016/0204274 A1* | 7/2016 | Fan | H01L 29/66825 257/319 |
| 2016/0240622 A1* | 8/2016 | Fan | H01L 29/42328 |

* cited by examiner

NON-VOLATILE MEMORY UNIT AND METHOD FOR MANUFACTURING THE SAME

BACKGROUND

Technical Field

This disclosure relates to non-volatile memory unit and method for manufacturing the same, in particular, to a damascene and a flattening process using dielectric layer for hard mask to form erase gate (EG) and the selective gate (SG).

Related Art

A split gate unit is widely used in independent and embedded type non-volatile application. Since it has a smaller sector cleaning and a more easily supported circuit design, in the embedded non-volatile IC industry it becomes more and more important. For instance, could be used at the MCU and smartcard.

In previous non-volatile memory units of split gate of the Microchip™ and SST™ are consider to be easily manufactured and have a reliable reliabilities, thus are considered a most approval solution nowadays. In the core of the non-volatile memory unit, double layered polycrystalline silicon layer is consider as the floating gate of the first polycrystalline silicon layer and selective gate of the second polycrystalline silicon layer. As the IC device become smaller and smaller, the double polycrystalline silicon of slit gate could not satisfy the nowadays' trend.

By adding addition polycrystalline silicon layer for couple control gate, the tri-polycrystalline silicon split gate is getting smaller and also gains its importance. In the core of the non-volatile, in this technique, the three-layer polycrystalline silicon is considered as the floating gate of the first polycrystalline silicon layer, the second polycrystalline silicon layer as couple control gate, and the third polycrystalline silicon layer as erase gate/selective gate.

Similar to convention non-volatile memory unit of stacking gat, such as ETOX. First of all, formed the floating gate along the bit line direction, and formed the couple control gate (CG) as mask for etching the floating gate. By back-etching tri-polycrystalline silicon to form the erase gate and the select separator of the erase gate and selective gate. Since the erase gate and select separator includes different gate dielectric for different usage, so the fabrication process of the transistor oxide layer of the selective gate and the tunnel oxide layer have to be carefully consider.

Unfortunately, at the existing split gate structure and manufacturing method the above said request are hard to realize. The dielectric between the floating gate and the selective gate has to integrate to the combination of the tunneling oxide layer, which disposed between the floating gate and the selective gate. Therefore, the manufacturing process will be more complicate and lack of flexibility thus became a closed system. Finally and most importantly, now existing tri-polycrystalline silicon split gate cannot avoid involving etching, and growing of the oxidizing layer with rough surface of the floating gate. The floating gate is used in erasing the nodes. Assume that the surface of the polycrystalline silicon and the tunneling oxide layer are not carefully handle, the uneven micro surface structure of the floating gate polycrystalline silicon will not be able to cause the tunneling effect of the tunnel oxidation layer thus affect the reliability.

SUMMARY

In view of the aforementioned problems, this disclosure provides a non-volatile memory unit and method for manufacturing the same, to a damascene and a flattening process using dielectric layer for hard mask to form erase gate and selective gate.

Another objection of the present invention is to provide a non-volatile memory unit and method that could form ON or ONO separator at the sidewall of selective gate. With this arrangement, the floating gate and the selective gate could be electrically isolated.

Accordingly, this disclosure provides a method for manufacturing a non-volatile memory unit that comprises:
providing a substrate;
formed a first base dielectric layer on the substrate;
formed a sacrificial layer and a first polycrystalline silicon layer on the first base dielectric layer;
defining a first pattern opening and a second pattern opening at the first base dielectric layer, the sacrificial layer and the first polycrystalline silicon layer;
performing ion implantation according to the first pattern opening;
selectively changing the thickness of the first base dielectric layer in order to from damascene grooves that spaced apart along the horizontal direction;
formed a sidewall dielectric layer at two side of the first polycrystalline silicon layer and the sacrificial layer;
formed a second base dielectric layer on the substrate of the second pattern opening;
formed damascene grooves along the horizontal direction at the first polycrystalline silicon layer, the sacrificial layer and the sidewall dielectric layer;
formed a second polycrystalline silicon layer on the first base dielectric layer and the second base dielectric layer;
formed a covering dielectric layer on the second polycrystalline silicon layer;
formed a coupled dielectric layer on the first polycrystalline silicon layer, the sidewall dielectric layer and the covering dielectric layer;
selectively formed a third polycrystalline silicon layer on the coupled dielectric layer; and
defining a third pattern opening and performing ion implantation.

According to one embodiment of the present invention, the photoresist is applied at the region outside the first pattern opening and the second pattern opening, and the sacrificial layer and the first polycrystalline silicon layer without applying the photoresist are etched thus to form the first pattern opening and the second pattern opening. The sacrificial layer is disposed on the first polycrystalline silicon layer. The stacked sacrificial layer and the first polycrystalline silicon layer are separated by the first pattern opening and the second pattern opening along the horizontal direction.

According to one embodiment of the present invention, the first polycrystalline silicon further comprising a floating gate (FG) formed on the first base dielectric layer via the first pattern opening and the second pattern opening.

According to one embodiment of the present invention, via the second pattern opening, formed a thinned first base dielectric layer under the second pattern opening.

According to one embodiment of the present invention, via the second pattern opening, a thinned first base dielectric layer under the second pattern opening is formed.

According to one embodiment of the present invention, a separator at each side of the sacrificial layer upon the second pattern opening is formed, and the separators are electrically isolated.

According to one embodiment of the present invention, a temporary sidewall dielectric layer at the sidewall of the first polycrystalline silicon layer is formed, and the thickness of the first base dielectric layer is increased. Thus, the temporary sidewall dielectric layer on the sidewall of the first polycrystalline silicon layer is connected to the first base dielectric layer.

According to one embodiment of the present invention, the thickness of the first base dielectric layer may be changed, when the temporary sidewall dielectric layer that formed at the sidewall of the first polycrystalline silicon layer is removed.

According to one embodiment of the present invention, a temporary base dielectric layer at the second pattern opening at the substrate is formed. A trench above second pattern opening and the between the temporary base dielectric layer and the sidewall dielectric layer is also formed.

According to one embodiment of the present invention, according to the mask defined by the second pattern opening, the temporary base dielectric layer at the second pattern opening is removed.

According to one embodiment of the present invention, a separator at each side of the sidewall of the sacrificial layer at the second pattern opening is formed, and the separators is electrically isolated.

According to one embodiment of the present invention, a fourth polycrystalline silicon layer is formed. The fourth polycrystalline silicon layer and second polycrystalline silicon layer both are formed in the damascene grooves. Wherein the second polycrystalline silicon layer is formed in the damascene grooves of the first pattern opening and the fourth polycrystalline silicon layer is formed in the damascene grooves of the second pattern opening.

According to one embodiment of the present invention, the sacrificial layers outside first and the second pattern openings are removed.

According to one embodiment of the present invention, defining a third pattern opening, defining the region outside the third pattern opening as a mask. The second polycrystalline silicon layer outside the third pattern opening is removed.

According to one embodiment of the present invention, a first dielectric layer is defined, the first dielectric layer comprising the first and the second base dielectric layers formed on the substrate.

According to one embodiment of the present invention, a second dielectric layer is defined. The second dielectric layer comprises the sidewall dielectric layer formed at two sides of the sacrificial layer and the first polycrystalline silicon layer, and the covering dielectric layer formed on the second polycrystalline silicon layer, wherein the second dielectric layer covers the erase gate (EG) and the selective gate (SG).

This disclosure further discloses non-volatile memory unit includes a substrate, a first dielectric layer, an erase gate, a floating gate, a second dielectric layer and couple control gate.

The substrate has a source region and a drain region formed on the surface of the substrate, and the source region and the drain region are separated apart via a channel region. The first dielectric layer forms on the substrate and defines a first pattern opening along the depth direction on the first dielectric layer. The erase gate (EG) forms on the first dielectric layer and disposed upon the first pattern opening's projection along the depth direction. The floating gate (FG) forms on the first dielectric layer and near the erase gate. The selective gate (SG) forms on the first dielectric layer and near the floating gate, wherein the selective gate and the floating gate are disposed upon the projection of the channel region along the depth direction. The second dielectric layer forms on the first dielectric layer and covers the erase gate and the selective gate, wherein the floating gate is disposed between two adjacent second dielectric layers. The coupled dielectric layer, formed on the erase gate, the floating gate, the selective gate and the second dielectric layer. The couple control gate (CG), formed on the coupled dielectric layer.

A first pattern opening of the first dielectric layer has a first thickness. The first dielectric layer below the projection of the floating gate has a second thickness, and the thickness of the first dielectric layer below the projection of the selective gate is defined as a third thickness. The first thickness is thicker than the second thickness, and the second thickness is thicker than the third thickness.

According to one embodiment of the present invention, the second dielectric layer is disposed between the two sides of the erase gate, and the second dielectric layer is formed from two sides of the first pattern opening from the central of the erase gate According to one embodiment of the present invention, the first dielectric layer has a second pattern opening, which defined by the selective gate (SG) along the depth direction.

According to one embodiment of the present invention, the first dielectric layer has a third pattern opening, which is defined by the source region along the depth direction.

According to one embodiment of the present invention, the selective gate (SG) further comprises a separator formed above the second pattern opening at each side of the selective gate (SG), and the separator is electrically isolated.

According to one embodiment of the present invention, the erase gate (EG) and the selective gate (SG) are formed in the damascene grooves, and the floating gate (FG) and the second dielectric layer are disposed between the erase gate (EG) and the selective gate (SG).

According to one embodiment of the present invention, the second dielectric layer that formed above the erase gate (EG) and the selective gate (SG) is covered by a covering dielectric layer and the covering dielectric layer is parallel to the first dielectric layer.

BRIEF DESCRIPTION OF THE DRAWINGS

This disclosure will become more fully understood from the detailed description given herein below for illustration only, and thus not limitative of this disclosure, wherein.

DETAILED DESCRIPTION

In the following description related to semiconductor processes, the terms common in the semiconductor processing field, such as the techniques of "formation of an oxidation layer", "lithography", "etching", "cleaning", "diffusion", "ion implantation", "chemical and physical vapor deposition", will not be described to avoid redundancy if these terms do not involve the technical features of the present invention.

Present invention disclosed a scale-down, reliable polycrystalline silicon to polycrystalline silicon, and characterize at erasing at the interface of polycrystalline silicon to source gate. Present invention is related to structure and manufacture method of a non-volatile memory unit 2 of tri-polycrystalline silicon split gate.

With the help of the depositing and flattening processes of the first polycrystalline silicon, and the sacrificial layer 16 (such as silicon nitride, silicon oxidation, or the combination of the two) could form a stable structure for the pattern definitions of the erase gate (EG) 21 and the selective gate (FG) 22.

Figure 1A:
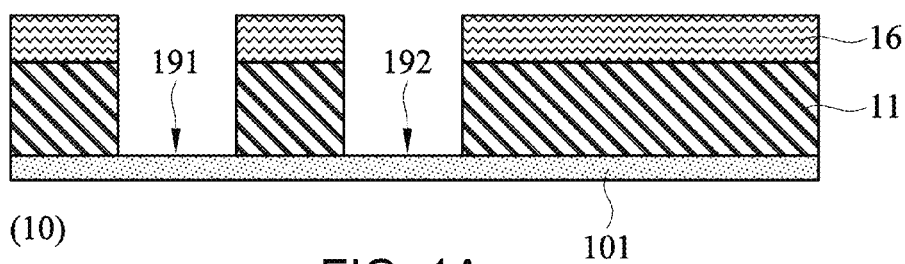
FIG. 1A-1N are cross-sectional views illustrating the non-volatile memory unit and the formation of the non-volatile memory unit according to the present invention.

In present invention a method for manufacturing a non-volatile memory unit (Si) is provided. More particularly, the non-volatile memory unit 2 is tri-polycrystalline silicon split gate. Please refer to FIG. 1A. First of all, provides a substrate 10 (S101). The substrate 10 could be p-type or n-type substrate. Via some technique of the conventional semiconductor process, multiple layers are stacked on the substrate 10 to provide the semiconductor unit. Then, forms a first base dielectric layer 101 on the substrate 10, the first base dielectric layer 101 could be made of silicon oxide ($SiO_2$). By the high-temperature thermal oxidation, the silicon substrate is oxidized to silicon oxide, which thickness is range from 100-200 nm.

Further, form a stacked structure of the sacrificial layer 16 and the first polycrystalline silicon layer 11, and the sacrificial layer 16 and the first polycrystalline silicon layer 11 are formed in sequence on the first base dielectric layer 101, and defines pattern on the photoresist via lithography mean. The sacrificial layer 16 and the first polycrystalline silicon layer 11 form the first pattern opening 191 and a second pattern opening 192 (S103). That is, the sacrificial layers 16 and the stacked structure of the first polycrystalline silicon layer 11 are formed on the first base dielectric layer 101 at the region outside the first pattern opening 191 and a second pattern opening 192.

In addition, the sacrificial layers 16 and the stacked structure of the first polycrystalline silicon layer 11 that the adjacent to each other is separated. For instance, after disposing the polycrystalline silicon, the polycrystalline silicon will be etched to predetermined thickness, and one of the first polycrystalline silicon 11 is the floating gate (FG) 23.

As for the pattern opening, a photoresist layer or a mask layer is made in advance. By the means of lithography or with the combination of lithography and etching technique, the photoresist is patterned. Therefore, there will be no photoresist or mask within this region, photoresist or mask will only dispose outside this region. The vacant or opening at the photoresist or mask layer is called pattern opening.

In one of the embodiment of present invention, the thickness of the sacrificial layer 16 is range from 200-1500 nm, preferably 700 nm. Sacrificial layer 16 could be a single silicon nitride (SiN) layer, nitride-oxide-silicon complex (SiON), or a multiple stacked dielectric layer. The multiple stacked dielectric layer could be oxide-nitride-oxide (ONO) or oxide-nitride-oxide-nitride (ONON). Others, the thickness of the first polycrystalline silicon 11 ranges from 300-2000 nm, preferably 1000 nm.

Figure 1B:
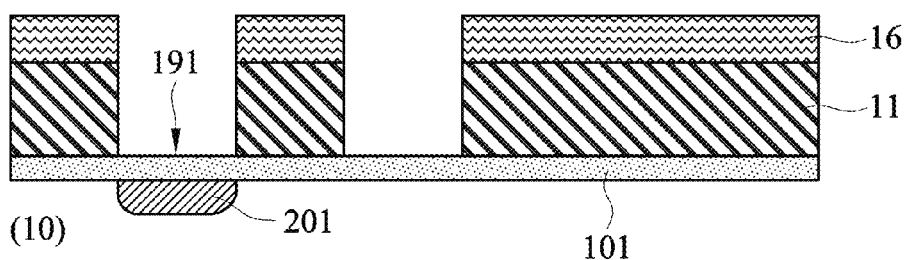

Please refer to FIG. 1B, shows the ion implantation performing step (S104). Performing ion implantation at the substrate 10 according to the first pattern opening 191, and the source region 201 is formed on the surface of the substrate 10. The source region 201 includes a diffusion region. For instance, one could apply ion implantation performing step on a p-type substrate for a N-well source region 201.

Figure 1C:
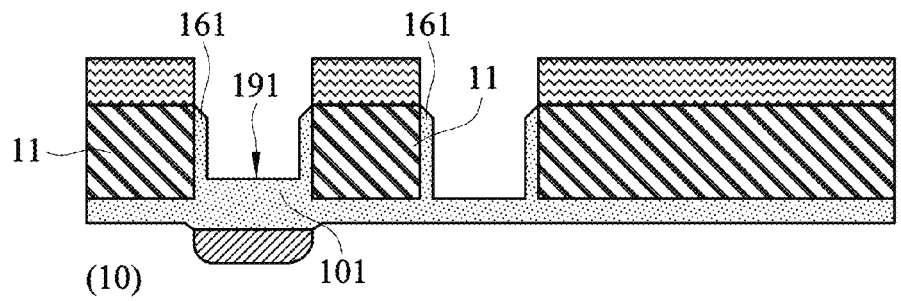

Then refer to FIG. 1C, for the source region 201 that made by the ion implanting process, selectively changing the thickness of the first base dielectric layer 101 (S105). Via the first pattern opening 191, formed a thickened first base dielectric layer 101 under the first pattern opening 191. For example, by the thermal oxidation the silicon oxide could be thickened. The silicon oxide could be thickened from 100-200 nm to 300-600 nm, preferably 450 nm. Others, the thickness of the first base dielectric layer 101 could also be thickened by applying a deposition process that disposed dielectric material on the first base dielectric layer 101.

Accordingly, while the thickness of first base dielectric layer 101 is increased, a temporary sidewall dielectric layer 161 is formed on the sidewall of the first polycrystalline silicon layer 11. At the same time, the temporary sidewall dielectric layer 161 could connect the first base dielectric layer 101. For instance, the thickness the silicon oxide of the first base dielectric layer 101 is increased, the sidewall of the first polycrystalline silicon layer 11 will be oxidized to form the temporary sidewall dielectric layer 161 by the means of high temperature oxidation.

Figure 1D:
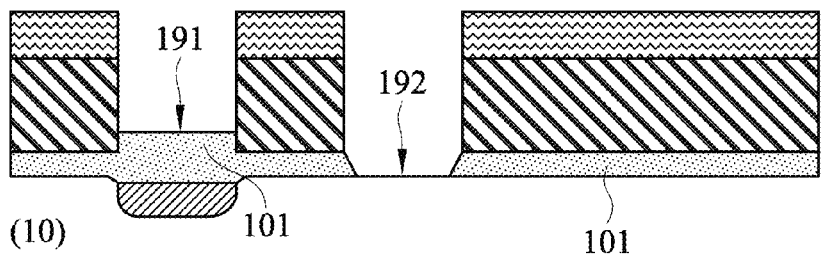

Please refer to FIG. 1D, the thickness of the first base dielectric layer 101 below the first pattern opening 191 may be increased. Then a non-selective wet etching process is performed on the first base dielectric layer 101. The thickness of the first base dielectric layer 101 is changed to reduce the thickness of the first base dielectric layer 101 (S106). For instance, during the thinner process, a temporary sidewall dielectric layer 161 at the sidewall of the first polycrystalline silicon layer 11 is erased. Via the second pattern opening 192, the thickness of the first base dielectric layer 101 below the second pattern opening 192 is thinner. For example, by the means of reactive ion etching (RIE) or wet etching could remove the original the first base dielectric layer 101 and form a thinner dielectric layer. The dielectric layer will be thinner to 10-150 nm from 100-200 nm.

Figure 1E:
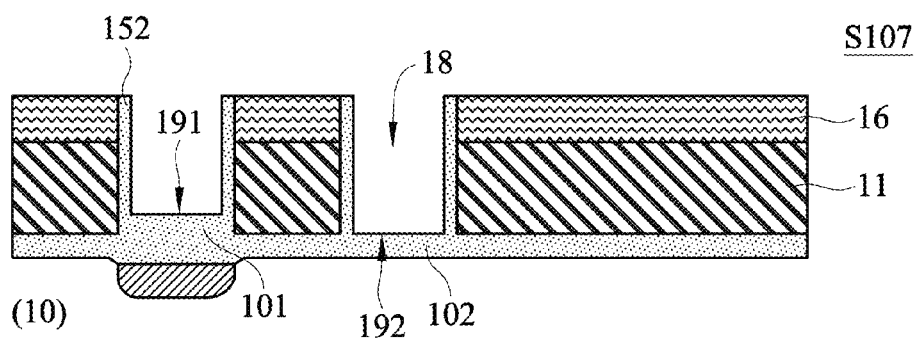

Please refer to FIG. 1E, a sidewall dielectric layer 152 and a temporary base dielectric layer 162 are formed (step 107). The sidewall dielectric layer 152 on the first polycrystalline silicon 11 and the sacrificial layer 16, and the temporary base dielectric layer 162 on the substrate 10 are formed at the same time. Furthermore, along the depth direction of the second pattern opening 192 of the first base dielectric layer 101, the first polycrystalline silicon 11, the sacrificial layer 16, and the sidewall dielectric layer 152 are separated. Therefore, at the second pattern opening 192, a notch 18 is formed at the interval of the base dielectric layer 162 and the sidewall dielectric layer 152. The first base dielectric layer 101, the sidewall dielectric layer 152 and/or the temporary base dielectric layer 162 may be formed by chemical vapor deposition or high temperature oxidation.

Particularly, at the sidewall dielectric layer 152 above the first pattern opening 191, form two sides of the first pattern opening to the central direction of the erase gate (EG) 21, the sidewall dielectric layer 152 of the second dielectric layer 26 is formed at two sides of the floating gate (FG) 23.

The width of the first pattern opening 191 along the horizontal direction is smaller than the width of the erase gate (EG). On other way of speaking, the first pattern opening 191 along the horizontal direction is disposed between the interval that formed by two sacrificial layers 16 that adjacent to each other, which includes the erase gate (EG) and the sidewall dielectric layer 152.

Figure 1F:
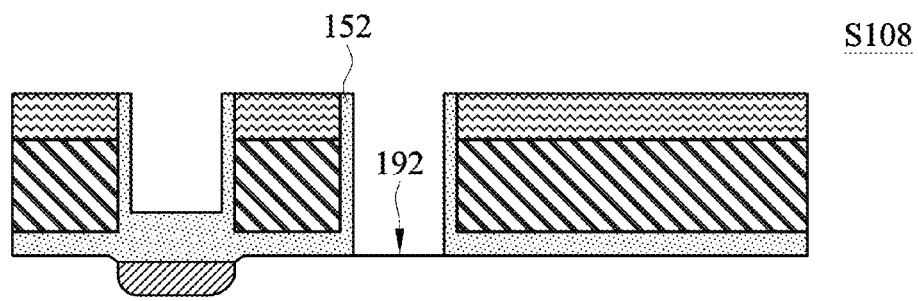

Please refer to FIG. 1F, by the means of lithography the notch 18 outside the first base dielectric layer 101 is defined as a mask. The temporary base dielectric layer 162 under the notch 18 is removed (step 108). The sidewall dielectric layer 152 at two sides of the notch 18 is not removed and the substrate 10 under the notch 18 is not covered by any material.

Figure 1G:
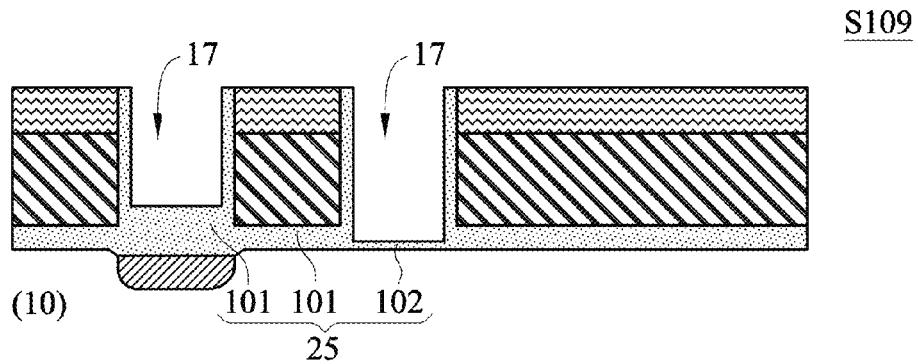

Please refer to FIG. 1G, a second base dielectric layer 102 is formed on the substrate 10 (step 102). After removing the temporary base dielectric layer 162 along the horizontal direction on the second pattern opening 192, the notch 18 of the substrate 10 at the second pattern opening 192 is not covered by any material. Therefore, the second base dielectric layer 102 will be formed or deposited on the oxidized substrate 10. To be noted that, the second base dielectric layer 102 is disposed under the selective gate (SG) to be the transistor dielectric layer 292 of the selective gate (SG) 22.

More particularly, selectively thicken the first base dielectric layer 101 under the first pattern opening 191 and the second base dielectric layer 102 under the second pattern opening 192. Along the horizontal direction the polycrystalline silicon layer 11 and the sacrificial layer 16 are stacked at the first base dielectric layer 101 and the second base dielectric layer 102, and between the two the damascene grooves 17 are formed. The damascene grooves 17 are disposed at the projections of the first pattern opening 191 and the second pattern opening 192.

To be noted that in different patches and different manufacturing process, along the horizontal direction, the first dielectric layer 25 is defined at the dielectric layer. the first dielectric layer 25 includes the first base dielectric layer 101 under the floating gate (FG) 23 of the first polycrystalline silicon layer 11, the thicken first base dielectric layer 101 and the second base dielectric layer 10 formed at the substrate 10 under the notch 18 of the second pattern opening 192.

In one embodiment, the transistor dielectric layer 292 of the second base dielectric layer 102 has high-k dielectric material or low-k dielectric material, such as nitrided silicon oxide (SiON), zirconium oxide (HfO$_2$), or tantalum pentoxide (Ta$_2$O$_5$). Furthermore, the first base dielectric layer 101 at the second pattern opening 192 will maintain a thickness thinner than 20 nm, which is the thickness of equivalent oxide thickness, EOT. Except the above said steps, present invention could also include steps like annealing process or other defect reducing or removing process for the first base dielectric layer 101 and the second base dielectric layer 102.

Figure 1H:
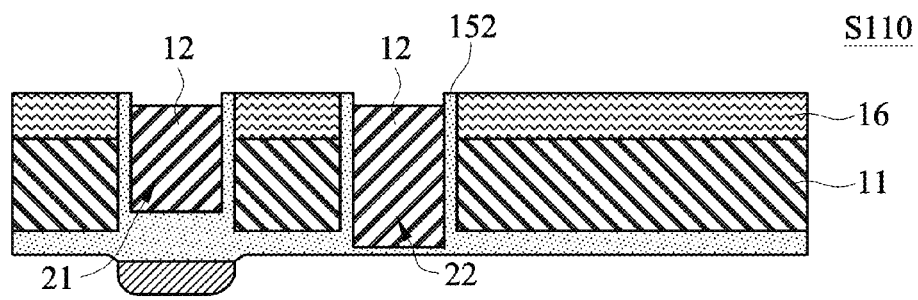

Please refer to FIG. 1H, a second polycrystalline silicon layer 12 is formed in the damascene grooves 17 above the first pattern opening 191 and the second pattern opening 192 (S110). The stacks of the first polycrystalline silicon layer 11 and the sacrificial layer 16 are disposed on the first base dielectric layer 101 in order to form the damascene grooves 17.

The second polycrystalline silicon layer 12 includes the erase gate (EG) 21 of the second polycrystalline silicon layer 12 at the first pattern opening 191 of the first base dielectric layer 101, and the selective gate (SG) 22 of the second polycrystalline silicon layer 12 at the second base dielectric layer 102. Wherein, the second polycrystalline silicon layer 12 includes the erase gate (EG) 21 and selective gate (SG) 22.

In other way of speaking, at the first pattern opening 191 of the first dielectric layer 25 forms an erase gate (EG) 21. At the second pattern opening 25 of the first dielectric layer 25 formed the selective gate (SG) 22. For example, by the means of high temperature oxidation or chemical vapor deposition, after disposing the poly-Si, the poly crystalline silicon is etched to a predetermined thickness to form into the erase gate (EG) 21 and selective gate (SG) 22.

Figure 1I:
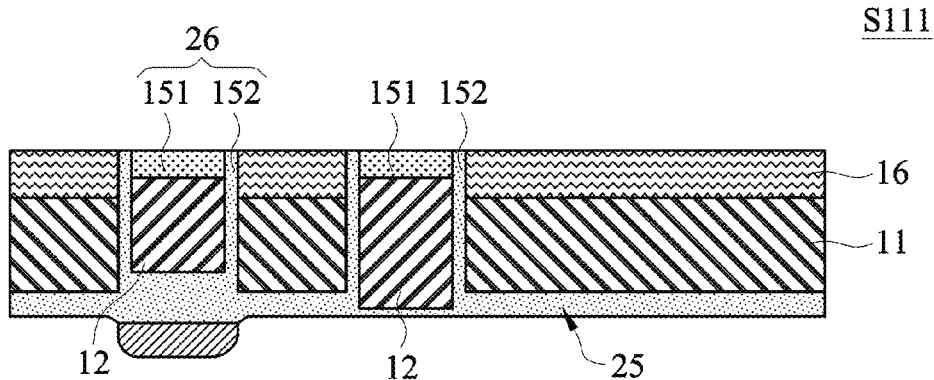

Please refer to FIG. 1I. First of all, forms a covering dielectric layer 151 (S111) on the second polycrystalline silicon layer 12. By the means of lithography, at the photoresist outside the damascene grooves 17 is defined as a mask, and a covering dielectric layer 151 is formed on the second polycrystalline silicon layer 12 within the damascene grooves. That is, the covering dielectric layer 151 is formed on the erase gate (EG) 21 and selective gate (SG) 22. For instance, by the mean of chemical vapor deposition (CVD), the covering dielectric layer 151 is deposited and the covering dielectric layer 151 is covered and etched to a predetermined thickness. Or by the means of thermal oxidation, the second polycrystalline silicon layer 12 could form into the covering dielectric layer 151.

More importantly, defines a second dielectric layer 26, which includes a sidewall dielectric layer 152 and a covering dielectric layer 151 of the first base dielectric layer 101. That is, the second dielectric layer 26 on the first dielectric layer 25 covers the second polycrystalline silicon layer 12. Others, defines a tunneling dielectric layer 291, which defines between the erase gate (EG) 21 of the first polycrystalline silicon layer 11 and the sidewall dielectric layer 152 of the second polycrystalline silicon layer 12. In other words, the second dielectric layer 26 includes the tunneling dielectric layer 291 of the sidewall dielectric layer 152 and covering dielectric layer 151.

Figure 1J:
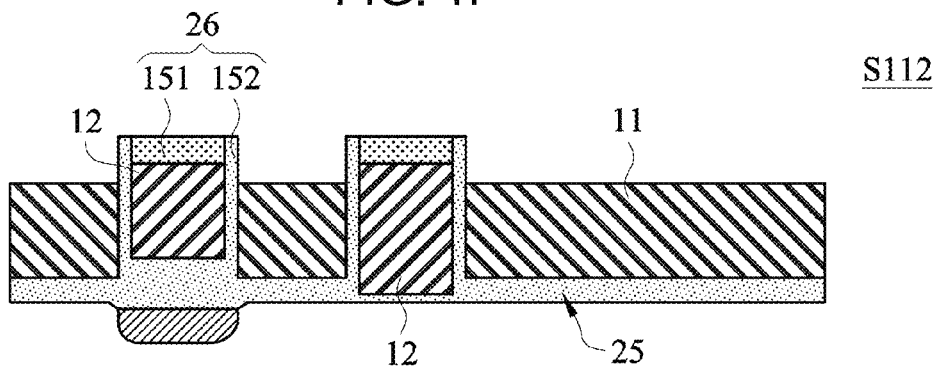

Please refer to FIG. 1J, the sacrificial layer 16 is removed (S112). By the means of lithography, the region of the photoresist of the first pattern opening 191 and the second pattern opening 192 are defined as a mask. The sacrificial layer 16 of the polycrystalline silicon layer 11 outside the erase gate (EG) 21, the selective gate (SG) 22, the sidewall dielectric layer 152 and the second dielectric layer 26 along the horizontal direction is removed. Therefore, the second polycrystalline silicon layer 12 and the covering dielectric layer 151 are mutually apart from each other along the horizontal direction. The covering dielectric layer 151, the erase gate (EG) 21 that covered by the covering dielectric layer 151, and the selective gate (SG) 22 that covered by the covering dielectric layer 151 do not intersect with each other. For example, by reactive ion etching or by wet etching the silicon nitride of the sacrificial layer 16 is removed, and the covering dielectric layer 151 is not affected.

Figure 1K:
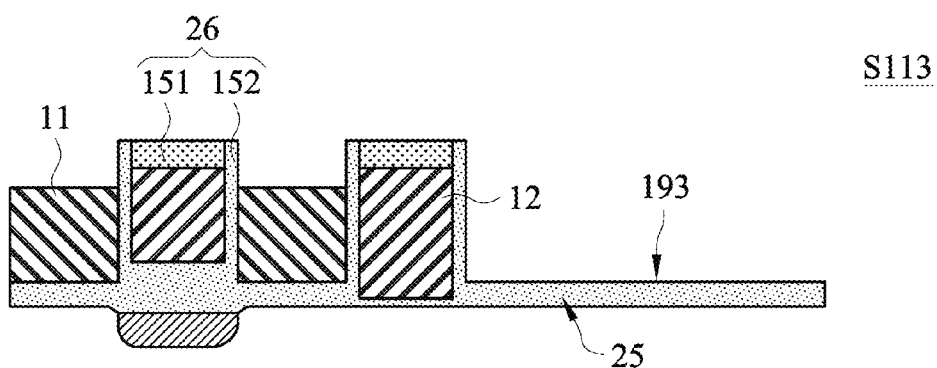

Please refer to FIG. 1K, by the means of lithography, a pattern is defined at the photoresist and the sacrificial layer 16 and the first polycrystalline silicon layer 11 form the third pattern opening 193. The first polycrystalline silicon layer 11 at the third pattern opening 193 is removed (S113). By the means of lithography, the patterned photoresist could be used as a mask to remove the first polycrystalline silicon layer 11 at the third pattern opening 193 along the depth direction, and the first polycrystalline silicon layer 11 above the projection of the drain region 202. That is, the first polycrystalline silicon layer 11 nears the selective gate (SG) 22 and away the floating gate (FG) 23 is removed. For example, by reactive ion etching or by wet etching the silicon nitride of the first polycrystalline silicon layer 11 is removed, and above said layers are not affected.

Figure 1L:
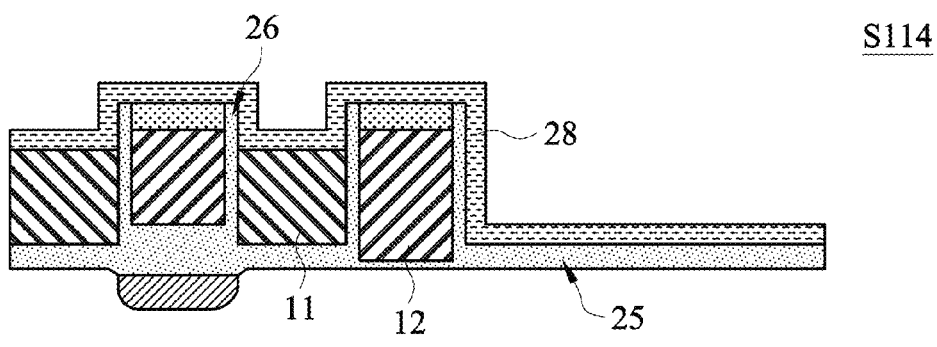

Please refer to FIG. 1L, a coupled dielectric layer 28 is formed on the second polycrystalline silicon layer 12, the covering dielectric layer 151 and the sidewall dielectric layer 152 (S114). The coupled dielectric layer 28 covers the above said the second polycrystalline silicon layer 12, the covering dielectric layer 151 and sidewall dielectric layer 152. For instance, by the mean of chemical vapor deposition (CVD), the stacked oxide-nitride-oxide (ONO) layer or the high-k dielectric material is disposed.

Figure 1M:
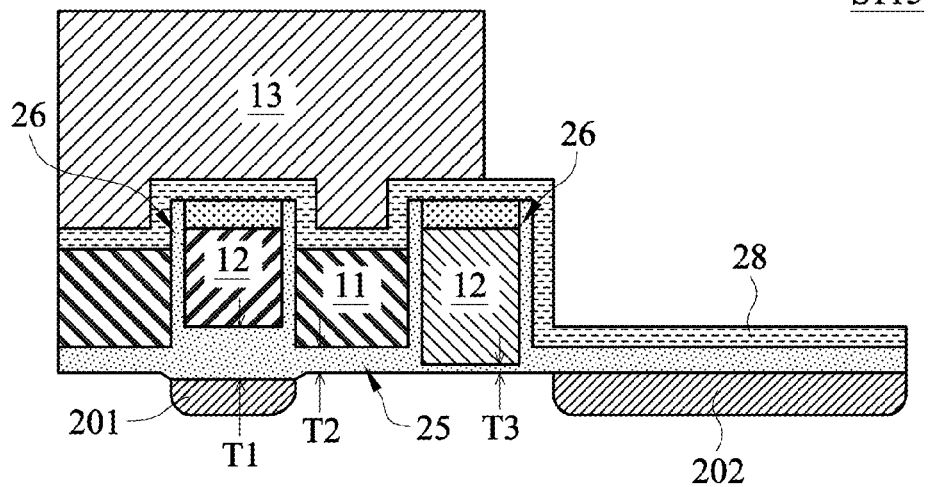

Please refer to FIG. 1M, a third polycrystalline silicon layer 13 is selectively formed on the coupled dielectric layer 28 (S115). By the means of lithography, the patterned photoresist could be used as a mask to dispose the third polycrystalline silicon layer 13 to form a couple control gate (CG) 24. Then, the couple control gate (CG) 24 of third polycrystalline silicon layer 13 covers the partial coupled dielectric layer 28. Then, ion implantation is performed according to the third pattern opening 193. A drain region 202 will be formed at the first base dielectric layer 101 and the coupled dielectric layer 28 overlapped region along the depth direction. Only portion of the first base dielectric layer 101 and the coupled dielectric layer 28 is stacked above the drain region 202. A channel region 203 is formed between the source region 201 and the drain region 202.

Finally, according to the method of the non-volatile memory unit (S1), the memory unit 2 is made in sequence.

Figure 1N:
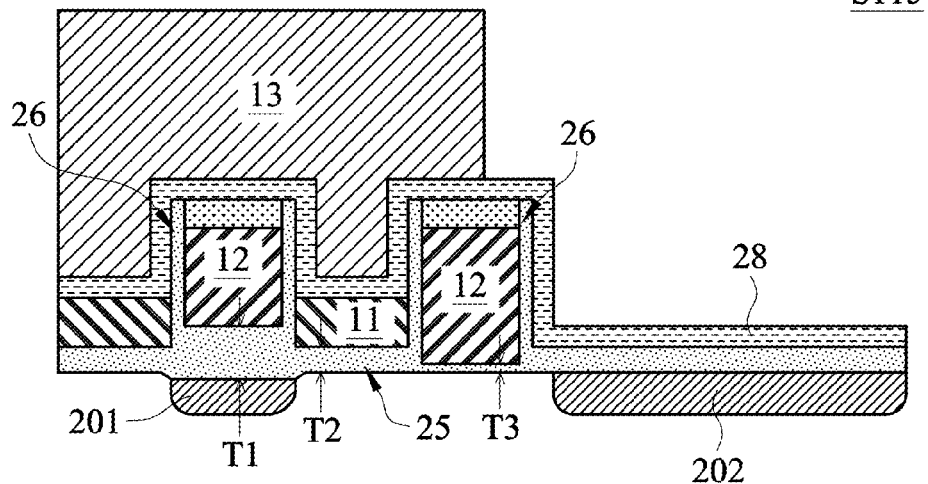

Other, please refer to FIG. 1J, By the means of lithography, the first polycrystalline silicon layer 11 and the sidewall dielectric layer 152 region is defined as a mask, and the second polycrystalline silicon layer 12 is filled at the interval between the first polycrystalline silicon layer 11 and the sidewall dielectric layer 152 along the horizontal direction. The second polycrystalline silicon layer 12 is etched to a predetermined thickness. The third polycrystalline silicon layer 13 is disposed at the coupled dielectric layer 28. Similarly, the third polycrystalline silicon layer 13 is etched to a predetermined thickness and formed into a couple control gate (CG) 24 that could independently control. Please refer to FIG. 1N, to finish the non-volatile memory unit 20.

More importantly, at the step S107-S109 of "forming a second base dielectric layer 102 and the sidewall dielectric layer 152", the present invention further defines a first dielectric layer 25 and a second dielectric layer 26. The first dielectric layer 25 and the second dielectric layer 26 respectively represent horizontal and vertical direction dielectric layers that are formed in different steps. First, the first dielectric layer 25 includes the first base dielectric layer 101 formed on the substrate 10 and the second base dielectric layer 102 formed on the substrate 10. The second dielectric layer 26 includes the sidewall dielectric layer 152 of the first base dielectric layer 101, and the covering dielectric layer 151. That is, the second dielectric layer 26 on the first dielectric layer 25 covers the second polycrystalline silicon layer 12.

In addition, a tunneling dielectric layer 291 is defined between the erase gate (EG) 21 of the first base dielectric layer 11 and the sidewall dielectric layer 152 of the floating gate (FG) 23 the second base dielectric layer 21. A transistor dielectric layer 292 is defined being disposed under the selective gate (SG) 22 of the second base dielectric layer 102. A floating gate dielectric layer 293 is defined being disposed under the floating gate (FG) 23 of the second polycrystalline silicon layer of the first base dielectric layer 101.

In other word, the first dielectric layer is defined, which comprises the transistor dielectric layer 292 of the second base dielectric layer 102 and floating gate dielectric layer 293 of the first base dielectric layer 101. Others, the second dielectric layer comprises the tunneling dielectric layer 291 of the sidewall dielectric layer 152 and the covering dielectric layer 151.

Others, the memory unit 2 is made. Dispose the first polycrystalline silicon layer 11 (S107) to form the erase gate (EG) 21 and the selective gate (SG) 22. Dispose the second polycrystalline silicon layer 12 (S112) to form the floating gate (FG) 23 of the second polycrystalline silicon layer 12. Dispose the third polycrystalline silicon layer 13 (S115) to form the couple control gate (CG) 24 of the third polycrystalline silicon layer 13.

In one embodiment, the erase gate (EG) 21 and the first pattern opening 191 are made in different patches and different manufacturing process. The first dielectric layer 25 has a first thickness T1 that range between 300-600 nm, the floating gate (FG) 23 along the depth direction. The second thickness T2 of the first dielectric layer 25 is range between 70-150 nm, preferably 100 nm. The selective gate (SG) and the second pattern opening along the depth direction, the transistor dielectric layer 292 of first dielectric layer 25 has a third thickness range between 50-150 nm. Except the above said steps, present invention could also include steps like annealing process or other defect reducing or removing process.

As for damascene, at step S110, the damascene grooves 17 could fill in the second polycrystalline silicon layer 12 and form a silicon dioxide ($SiO_2$) or Silicon nitride ($Si_3N_4$) layer as a hard mask. In the later process, such as removing photoresist, the hard mask could avoid the dielectric layer being destroyed during the etching process. Furthermore, part of the structure could apply the buried hard mask technique, with an etching stop layer or hard mask design could eliminate the alignment error during the structure constructing process.

Removing the sacrificial layer 16, then by back-filling and back-etching the patterned second polycrystalline silicon layer 12, a erase gate (EG) 21 and a selective gate (SG) 22 are formed. Before disposing every selective gate (SG) 22 and the floating gate (FG) 23 poly crystalline silicon (S112), the transistor dielectric layer 292 of the selective gate (SG) 22 and the tunneling dielectric layer 291 of the erase gate (EG) 21 are independently manufactured (S111). In the step (S111) of disposing the dielectric layer 15, the dielectric layer 15 is formed into a first dielectric layer 25 and a second dielectric layer 26. Therefore, the first dielectric layer 25 will be disposed below the projection of the floating gate (FG) 23 is floating gate dielectric layer 293. At the first dielectric layer 25 below the projection of the selective gate (SG) is the transistor dielectric layer 292 of the selective gate (SG) 22. The second dielectric layer 26 is disposed between the erase gate (EG) 21 and the floating gate (FG) 23, which the tunneling dielectric layer 291 of the erase gate (EG) 21.

Figure 2A:
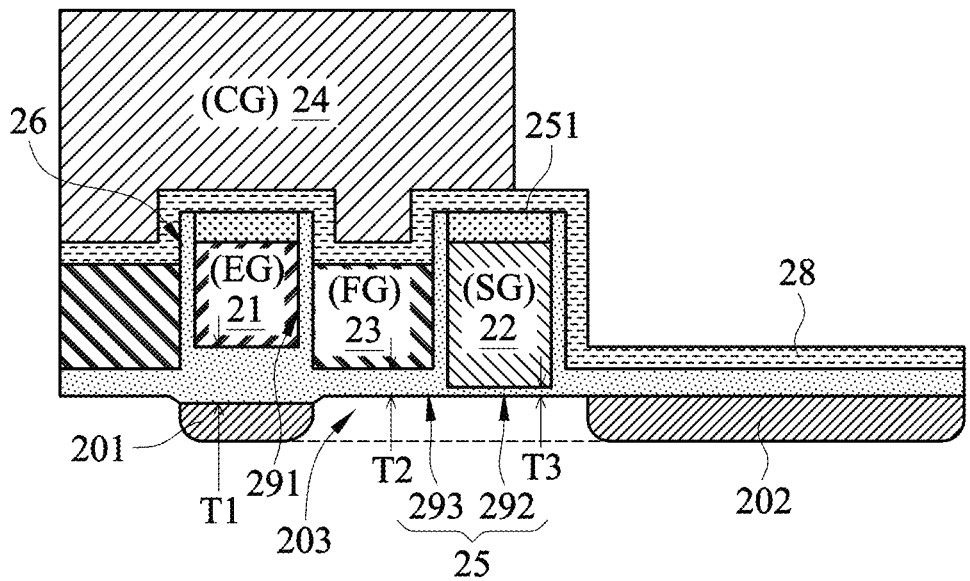
FIG. 2A-2B are cross-sectional views of the non-volatile memory unit in accordance the present invention.
Figure 2B:
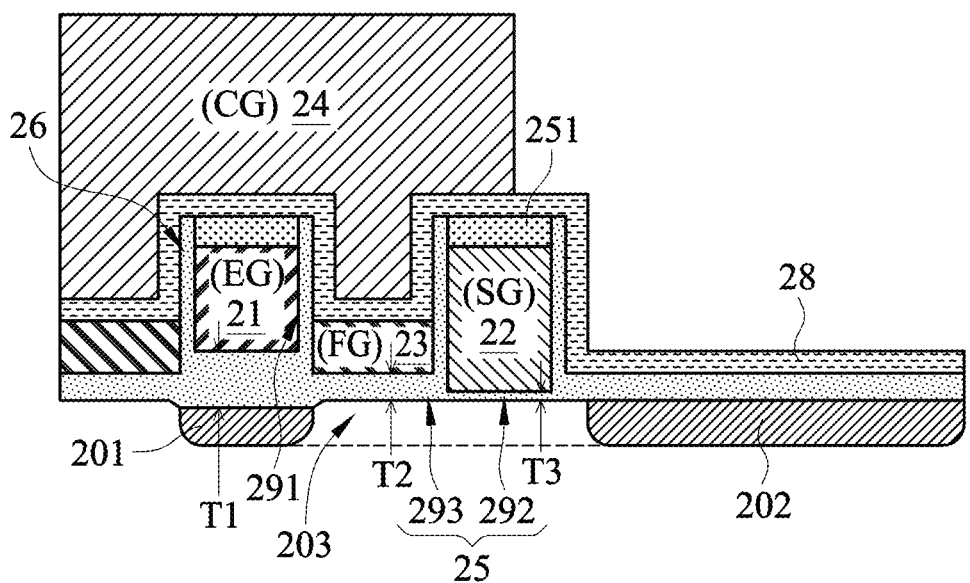

Please refer to FIGS. 2A and 2B, present invention is related to a non-volatile memory unit 2, particularly to a non-volatile memory unit 2 of tri-polycrystalline silicon split gate. The non-volatile memory unit 2 includes a substrate 10, which at the surface of the substrate 10 has a source region 201 and a drain region 202 that separated by a channel region 203.

Then a first dielectric layer 25 is formed at the substrate 10, and the first dielectric layer 25 has a first pattern opening 191 and a second pattern opening 192. The first pattern opening 191 could define the source region 201 along the depth direction. A floating gate (FG) 23 is formed on the first dielectric layer 25, and the floating gate (FG) 23 is near the erase gate (EG) 21. At the step S102 of forming the first polycrystalline silicon layer, the first polycrystalline silicon layer has a first polycrystalline silicon layer 11 that is disposed at the first pattern opening 191 and the second pattern opening 192. Part of the first polycrystalline silicon layer is disposed between the erase gate (EG) 21 and the selective gate (SG) 22. By the means of lithography, the second polycrystalline silicon layer 12 forms an independent region of the floating gate (FG) 23.

Then, forming an erase gate (EG) 21 on the first dielectric layer 25, the erase gate (EG) 21 is disposed at the projection of the first pattern opening 191 along the depth direction. At the step S110 of forming the second polycrystalline silicon layer 12, the second polycrystalline silicon layer 12 includes an erase gate (EG) 21 that is formed on the first pattern opening 191 of the first dielectric layer 25. At the step of forming the first dielectric layer 25 and the second dielectric layer 26, the first dielectric layer 25 further includes a first base dielectric layer 101.

Similarly, a selective gate (SG) 22 is formed on the first dielectric layer 25, the selective gate (SG) is disposed above the projection of the second pattern opening 192 along the depth direction, and the selective gate (SG) 22 is adjacent to the floating gate (FG) 23. The selective gate (SG) 22 and the floating gate (FG) 23 are disposed above the projection of the channel region 203. At the step S110 of forming the second polycrystalline silicon layer 12, the selective gate (SG) 22 and floating gate (FG) 23 could form in the damascene grooves 17. On the first dielectric layer 25 between the first polycrystalline silicon layer 11 and the second dielectric layer 26 the damascene grooves 17 are formed. The damascene grooves 17 are disposed above the projection of the first pattern opening 191 and the second pattern opening 192.

The second dielectric layer 26 is formed on the first dielectric layer 25. The second dielectric layer 26 covers the erase gate (EG) 21 and the selective gate (SG) 22. The floating gate (FG) 23 is disposed between two adjacent second dielectric layers 26. That is, the second dielectric layer 26 is disposed between the erase gate (EG) 21 and the floating gate (FG), and between the first dielectric layer 25 and the second dielectric layer 26.

At the step S109 the second dielectric layer 26 is formed on the first dielectric layer 25. The second dielectric layer 26 covers the erase gate (EG) 21 and the selective gate (SG) 22. The floating gate (FG) 23 is disposed between two adjacent second dielectric layers 26. Practically, the second dielectric layer 26 is formed from along direction of two sides of the first pattern opening, 191 and disposed at the two sides of the erase gate (EG) 21 to a second dielectric layer 26. The width of the first pattern opening 191 along the horizontal direction is equal to the width of the erase gate (EG) 21 and the second dielectric layer 26. In other way of speaking, only the erase gate (EG) 21 and the second dielectric layer 26 are disposed within the interval two adjacent sacrificial layers at the first pattern opening 191.

Accordingly, a coupled dielectric layer 28 is formed on the erase gate (EG) 21, floating gate (FG) 23, selective gate (SG) 22 and the second dielectric layer 26. At the step S114 of forming the coupled dielectric layer 28, the coupled dielectric layer 28 covers on the top of the above said layers. Please refer to 1M, the coupled dielectric layer 28 is a continuous concave and convex shape and covers the second dielectric layer 26, the erase gate (EG) 21, the selective gate (SG) 22 and the floating gate (FG) 23. Furthermore, as for FIG. 1N, contrast to the erase gate (EG) 21 and the selective gate (SG) 22, the coupled dielectric layer 28 of the floating gate (FG) 23 is relatively near the first dielectric layer 25 along the depth direction. Otherwise, the coupled dielectric layer 28 is covered along the first dielectric layer 25 and the second dielectric layer 26, so it is disposed on first dielectric layer 25 and the above the third pattern opening 193 along the depth direction. Also, the coupled dielectric layer 28 is close to a side of the selective gate (SG) 22 of the second dielectric layer 26 of the third pattern opening 193.

Last but not least, the couple control gate (CG) 24 is formed on the coupled dielectric layer 28. Therefore, in present invention the first pattern opening 191 of the first dielectric layer 25 has a first thickness T1, along the depth direction and below the projection of the floating gate (FG) 23 of the first dielectric layer 25 is defined as a second thickness T2, and along the depth direction below the projection of the selective gate (SG) 22 is defined as a third thickness T3. The first thickness T1 is thicker than the second thickness T2, and the second thickness is thicker than the third thickness T3.

Furthermore, the second dielectric layer 26 is disposed between the erase gate (EG) 21 and the floating gate (FG) 23, thus is disposed at the tunneling dielectric layer 291 of the erase gate (EG) 21. Others, the first dielectric layer 25 is disposed under the projection of the selective gate (SG) 22, that is, the transistor dielectric layer 292 of the selective gate (SG) 22. The first base dielectric layer is disposed under the projection of the floating gate (FG) 23, that is, the floating gate dielectric layer 293 of the floating gate (FG) 23.

In one embodiment, the first dielectric layer 25 has a first pattern opening 191, which is defined by the source region 201 along the depth direction. The first dielectric layer 25 has a second pattern opening 192, which defined by the selective gate (SG) 22 along the depth direction. The first dielectric layer 25 has a third pattern opening 193, which is defined by the source region 202 along the depth direction.

Figure 3A:
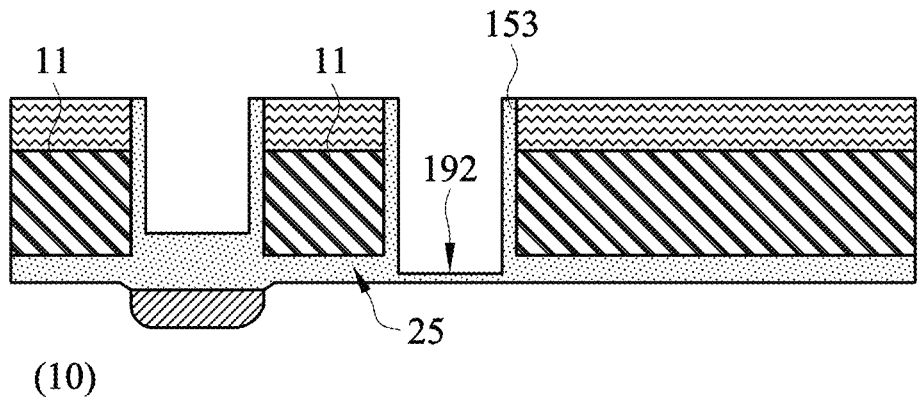
FIG. 3A-3B are cross-sectional views of the separator between the non-volatile memory units in accordance the present invention.
Figure 3B:
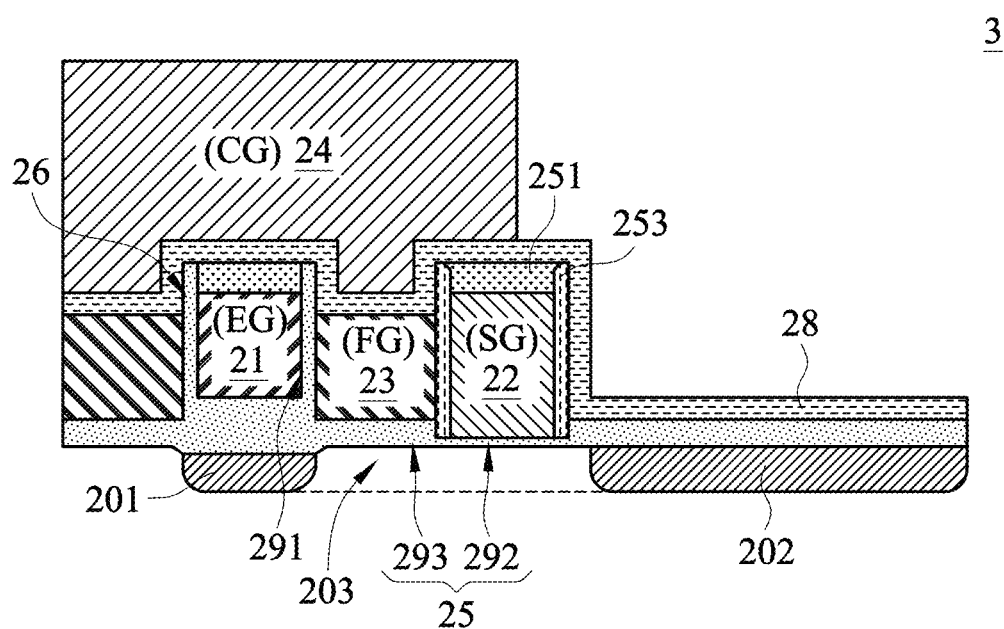

Please refer to FIG. 3A, in one embodiment, at two sides of the sidewall of the sacrificial layer 16 above the second pattern opening 192, a transistor dielectric layer 292 is formed on the substrate 10 (step S109), separators 153 are formed. The separators 153 are electrically isolated. Otherwise, silicon nitride and silicon oxide are continuous disposing and dry/wet etching. A necessary lithography process is applied, before disposing the polycrystalline silicon between the selective gate (SG) 22 and the floating gate 23 (FG) (step S112), to form ON or ONO separators 153 between the selective gate (SG) 22 and the floating gate 23 (FG). To realize the table insulation between the selective gate (SG) 22 and the floating gate 23 (FG) and avoid the dilemma of interfere. Please refer to FIG. 3B, FIG. 3B shows non-volatile memory units with separators 253.

Thus, in order to independently produce the tunneling dielectric layer 291 of the erase gate (EG) 21 and the transistor dielectric layer 292 of the selective gate (SG) 22, one of the remove and refilled polycrystalline silicon gate (normal SG) could be use and select for inserting extra polycrystalline silicon refill and flattening process. Continuous disposing and dry/wet etching of the silicon nitride and silicon oxide is contributed to erase the substrate of the erase gate (EG) 21 and the selective gate (SG) 22. The tunneling dielectric layer 291 and the transistor dielectric layer 292 are selectively connected.

Figure 4A:
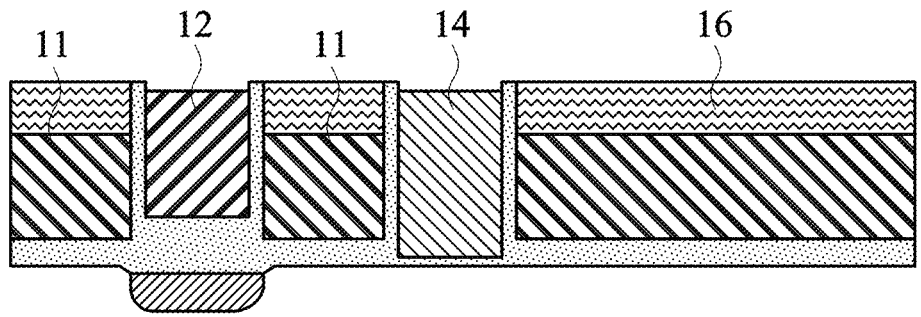
FIG. 4A-4B are cross-sectional views of the non-volatile memory unit in accordance the present invention.

Please refer to FIG. 4A, in one embodiment, after the step S109 of forming the transistor dielectric layer 292, at the step 110 of forming the second polycrystalline silicon layer 12, a fourth polycrystalline silicon layer 14 is formed. The fourth polycrystalline 14 and the second polycrystalline silicon layer 12 both are formed in the damascene grooves 17. The second polycrystalline silicon layer 12 is formed in the damascene grooves 17 of the first pattern opening 191. The fourth polycrystalline silicon layer 14 is formed in the damascene grooves 17 of the second pattern opening 192. The damascene grooves 17 that forms separated regions along the horizontal direction are formed by the first polycrystalline silicon layer 11, the sacrificial layer 16 and the sidewall dielectric layer 152.

Figure 4B:
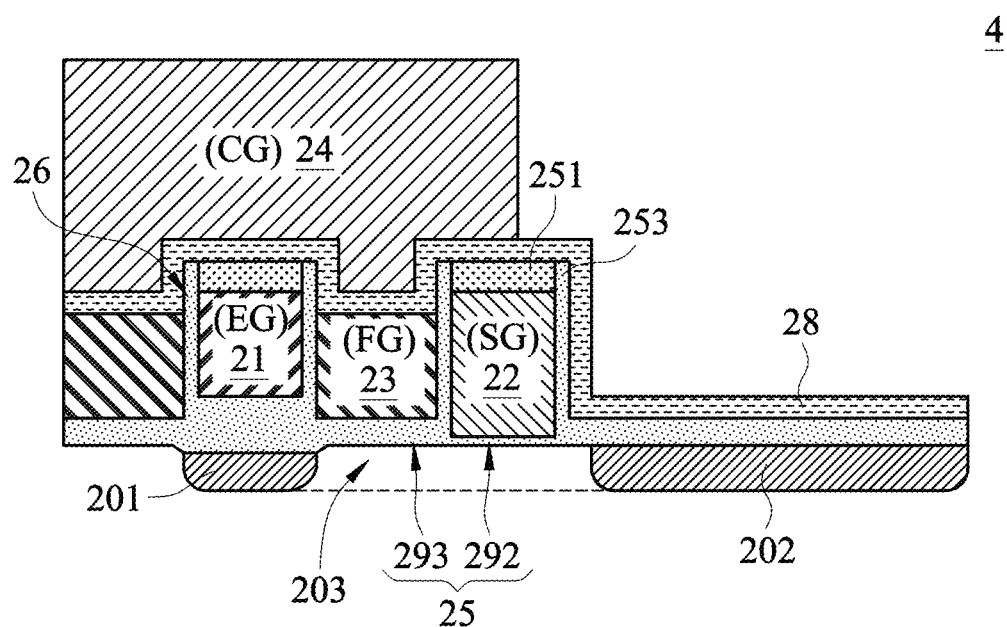

Please refer to FIG. 4B, present invention provides a 4-layered polycrystalline silicon split gate of the non-volatile memory unit 4 that has fourth polycrystalline silicon layer 14. Present invention has the advantage that the sidewall dielectric layer 152 and the transistor dielectric layer 292 of the selective gate (SG) could be independently manufacture. The auxiliary transistor is hot electron injected via nominal channel; the programmed of the selective gate (SG) is program via low current to the non-volatile memory unit 2 (via conventional stack gate ETOX). The non-volatile memory units 2, 20, 3, 4 of the present invention could be erased via the erase gate (EG) 21 and/or the diffusion of the source region 201.

The non-volatile memory arrays 2 of the present invention program a low power hot electron injection programming, and a high reliability poly silicon and poly silicon tunneling and erasing, and low voltage logically compatible character. By rapidly program the logically compatible oxide layer of the selective gate damascene (SG, WL) 22, the programmed voltage and current could be precisely control. By preformed the tunneling dielectric layer 291 and the pad separators 253 of ON or ONO, the erasing injecting terminal of the floating gate 23 (FG) has an undestroyed and fine surface therefore provides a highly reliability erasing.

More important, since the present invention will be integrated with other advanced logic compatibility to scale down in size, the programming voltage will be easily reached. The transistor oxide layer of the selective gate damascene could integrate to allow the maximum current output. The above non-volatile memory unit of split gate is made of damascene process, and could be used with conventional flattening unit structure such FINFET. There will be no difficult for additional scaling down.

According to some application, such as EEPROM, the erase gate (EG) 21 and the couple control gate (CG) 24 could be physically or electrically connected to each other. In other embodiment of the invention, the couple control gate (CG) 24 could replace the erase gate (EG) 21 to enhances the coupling ratio of low voltage operation of the floating gate (FG) 23.

During the electron erasing period, the trapping of the tunneling oxide layer is considered as the major reason of narrowing the operating cycle and the decaying the withstand voltage. Usually, the silicon oxide growing at high temperature or CVD of silicon hydride (SiH$_4$) reaction could form the oxide layer both are fine tunneling dielectric layer 291. By depicting the content of the nitride in the silicon oxide, the silicon oxide is processed by the nitrogen oxide (NO) or the nitrous oxide (N$_2$O), in order to reduce the trap density at the interface of the silicon oxide and silicon oxide-silicon oxide.

Silicon oxide contains excess nitride will become serious electron trap, in some extreme cases such as SONOS. Film with abundance nitride could be used as a storage media of the electrons but not for obvious tunneling route. Therefore, the content of the nitride of the silicon oxide has to be control. In the present invention, the major advantage of the sequence in the process is that the transistor dielectric layer 292 of the selective gate (SG) 22 and the tunneling dielectric layer 291 of the erase gate (EG) 21 could be independently manufactured.

Please refer to FIG. 1G, the high-k dielectric material is used in the transistor of the selective gate (SG) 22 (includes nitride-oxide-silicon complex). Since logic circuit and the technique node of the major data stream scale down, after removing the sacrificial layer 16, by using high-k dielectric material such as HfO2、Ta2O5 for dielectric of selective gate (SG) 22. Although the high-k dielectric material has narrowband and could improve the tunneling effect of the sidewall dielectric layer 152, the tunneling effect of the sidewall dielectric layer 152 of the second dielectric 26 could not independently adjust. The advantage of manufacturing the sidewall dielectric layer 152 of the second dielectric 26 and the transistor dielectric layer 292 of the selective gate (SG) 22 independently is that the nitride-oxide-silicon complex (SiON) could be used as the dielectric layer of the selective gate (SG) 22. By the means of the conventional method, the nitric oxide (NO) and the nitrous oxide (N2O) of the tunneling dielectric layer 291 is improved, in order to control the nitrous content in the nitride-oxide-silicon complex.

Figure 5:
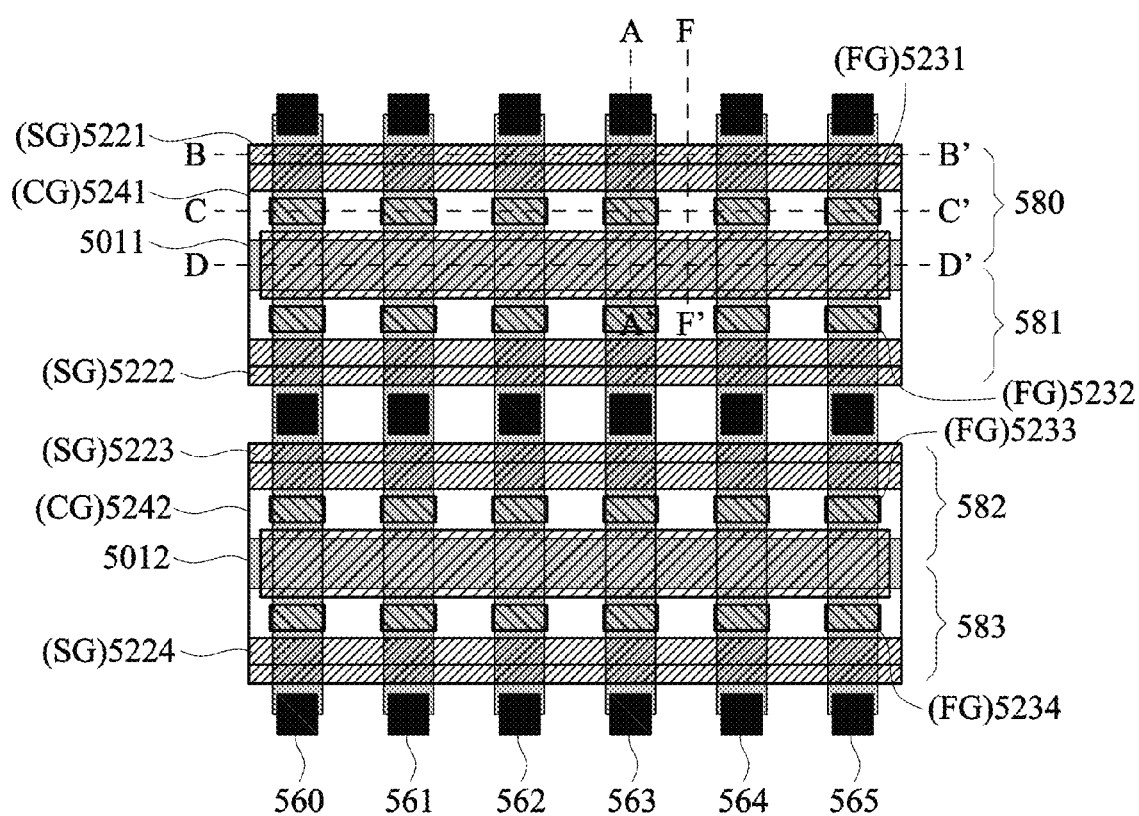
FIG. 5 is a schematic view illustrating the non-volatile memory unit array according to the present invention.

Please refer to FIG. 5, which shows a diagrammatic view illustrating the non-volatile memory unit array 5 that configured by non-volatile memory units 2, 20, 3 and 4 according to the present invention. Only part of the top surface of the non-volatile memory unit array 5 is shown in the top view. The non-volatile memory unit array 5 has several non-volatile memory units 2, 20, 3 and 4 that are arranged as a chess board pattern. More precisely, non-volatile memory units 2, 20, 3 and 4 are arranged along first direction X and second direction Y which is mutual vertical to each other. There are 24 sets of non-volatile memory units 2, 20, 3 and 4 shown in FIG. 5, 6 sets are arranged in first direction X and 4 sets are arranged in second direction Y.

Accordingly, selective gate (SG) 22 of each row is connected via the first direction X, and is electrically connected as shown in 5221, 5222, 5223 and 5224. The source region 201, shared each two adjacent columns of non-volatile memory units 2, 20, 3 and 4. As shown as 5011 and 5012, the shared source regions 201 at the same row connected via the first direction X and are electrically connected. As shown as 5241 and 5242, the shared couple control gate (CG) of each adjacent non-volatile memory units in every column via the first direction X and are electrically connected.

As shown as bit lines 560, 561, 562, 563, 564 and 565, the source regions 202 at each column via a through hole and a metal layer along the second direction Y are electrically connected. These floating gates (FG) 23 are independent and do not intersect with each other. The floating gates (FG) 23 are electrically insulated and do no connect with outside, in order to store the storing status of the non-volatile memory units 2, 20, 3 and 4. As shown in 5231, 5232, 5233 and 5234, the word lines 580, 581, 582 and 583 of the non-volatile memory units 2, 20, 3 and 4 are disposed correspondingly to each the floating gates (FG) 23.

Figure 6A:
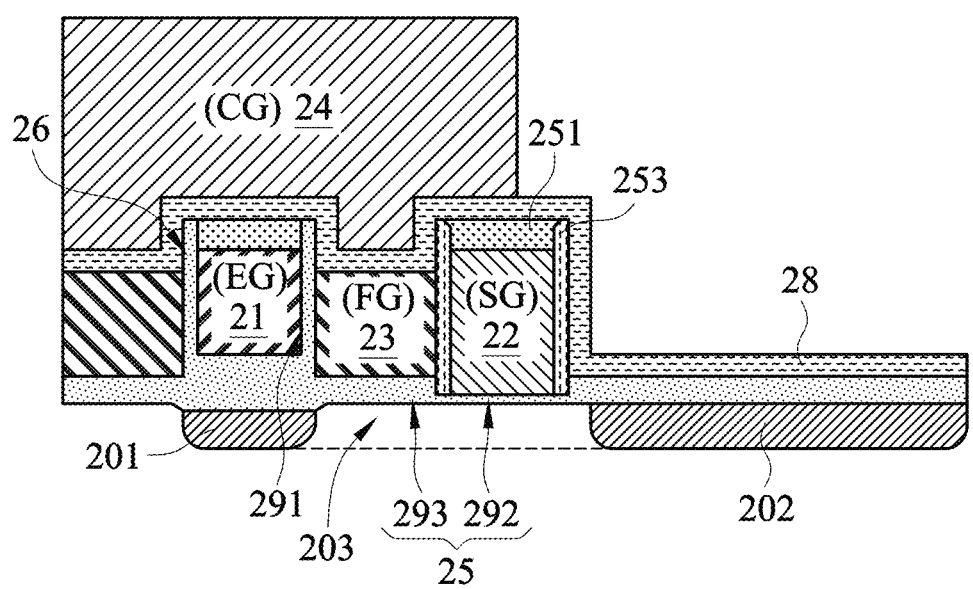
FIG. 6A-6E are cross-sectional views of a non-volatile memory unit array according to the present invention.
Figure 6B:
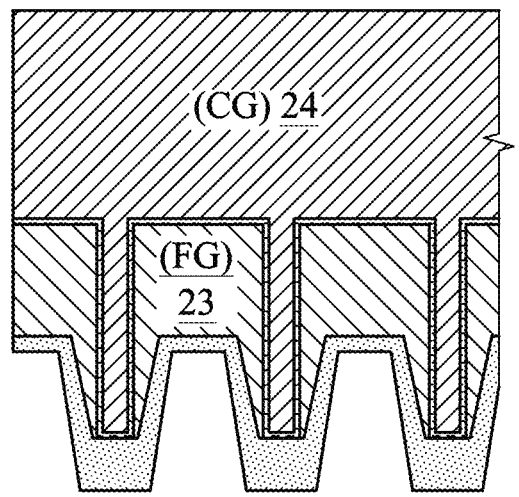
Figure 6C:
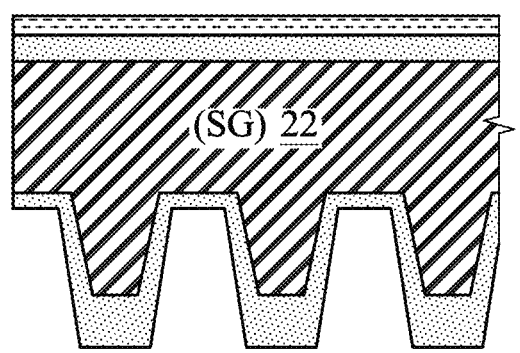
Figure 6D:
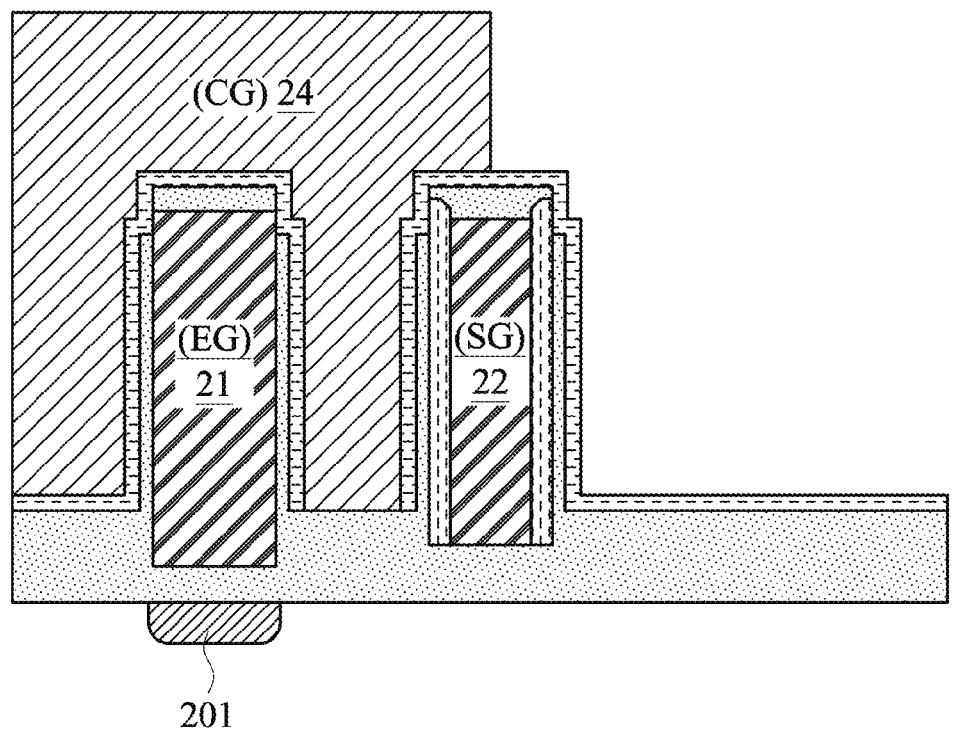
Figure 6E:
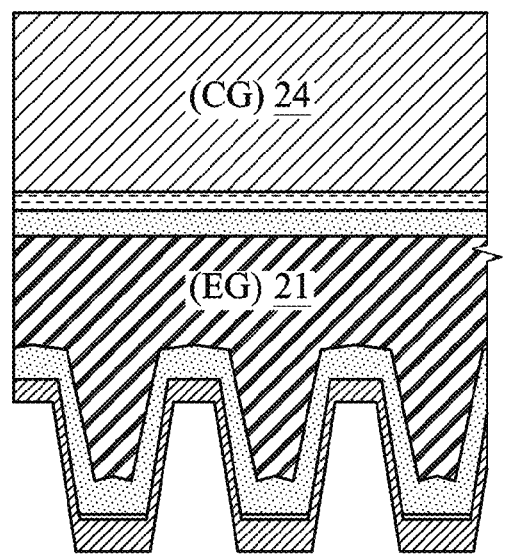

In one embodiment, please refer to FIG. 6A to FIG. 6E are the diagrammatic cross sectional views along different the cutting lines of present invention that applied at the bottom structure of the FinFET. The non-volatile memory units 3 that comprise separators 153 and 253 could configure the non-volatile memory array. Furthermore, FIG. 6A shows the cross sectional views along the cutting lines A-A'. FIG. 6B shows the cross sectional views along the cutting lines C-C'. FIG. 6C shows the cross sectional views along the cutting lines B-B'. FIG. 6D shows the cross sectional views along the cutting lines F-F'. FIG. 6E shows the cross sectional views along the cutting lines D-D'.

Below will explain the detail the operation method of the non-volatile memory unit array 5 configured by non-volatile memory units 2, 20, 3 and 4. As for non-volatile memory unit array's structure of the present invention, partial erase operation could be applied at any two adjacent rows of the shared source region 201. For example, erasing the word lines 582`583 of non-volatile memory units 2, 20, 3 and 4, more precisely erasing the two rows where the word lines 582`583 are disposed. At the shared source region 201, a 6V voltage is applied, and a negative 9V voltage is applied at the couple control gate (CG) 5242. Therefore, the electrons are removed from the floating gate (FG) 23 and tunneling to the source region 201. Then the equivalent polarity of these two rows of the floating gate (FG) 5233, 5234 will be positive voltage.

While undergoes an operation of writing "0", such as undergoes an operation of writing "0" at the word lines 582 of the non-volatile memory units 2, 20, 3 and 4. For example, 5-6 V is applied at the at source region 5012, 9V is applied at the couple control gate (CG) 5242, 0V is applied at drain region 202, 1V is applied at and the selective gate (SG) 5223. By the mechanism of the hot-electron injection, electrons are removed from the high electric field region of the channel to the floating gate (FG) 5233. Thus, the equivalent polarity of the floating gate (FG) 5233 will be negative voltage.

Perform a reading operation, such as a reading operation for word lines of non-volatile memory units 2, 20, 3 and 4. Applied 0V at source region 5012 and couple control gate (CG) 5242, or applied 1V at source region 202 applied and a supply voltage $V_{cc}$ at selective gate (SG) 5223. The channel below the selective gate (SG) 5223 will be on. Wherein the supply voltage $V_{cc}$ is the supply voltage of the memory circuit, in conventional amplifier using 0.18 micro CMOS technology, the supply voltage $V_{cc}$ will be 1.8V.

Assume that the status of the word lines 582 of the non-volatile memory units 2, 20, 3 and 4 are "0", that is the equivalent polarity of the floating gate (FG) 5233 will be negative voltage and the current in the channel is proximally 0. On the other hand, the status of word lines 582 of the non-volatile memory units 2, 20, 3 and 4 are "1", that is the equivalent polarity of the floating gate (FG) 5233 will be positive voltage. During then, the current exist in the channel is about 30 nm. By detecting the channel current of the channel region 203, the storage content of the non-volatile memory units 2, 20, 3 and 4 are known.

The foregoing description of the exemplary embodiments of the disclosure has been presented only for the purposes of illustration and description and is not intended to be exhaustive or to limit the disclosure to the precise forms disclosed. Many modifications and variations are possible in light of everything above. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope.

Accordingly, the scope of the present disclosure is defined by the appended claims rather than the foregoing description and the exemplary embodiments described therein.

What is claimed is:
1. A method for manufacturing a non-volatile memory unit, comprising the steps of:
   (1) providing a substrate;
   (2) forming a first base dielectric layer on the substrate;
   (3) forming a sacrificial layer and a first polycrystalline silicon layer on the first base dielectric layer;
   (4) defining a first pattern opening and a second pattern opening at the first base dielectric layer, the sacrificial layer and the first polycrystalline silicon layer;
   (5) performing a first ion implantation according to the first pattern opening;
   (6) selectively changing a thickness of the first base dielectric layer in order to form damascene grooves that are spaced apart along a horizontal direction;
   (7) forming a sidewall dielectric layer at two side of the first polycrystalline silicon layer and the sacrificial layer;
   (8) forming a second base dielectric layer on the substrate of the second pattern opening;
   (9) forming damascene grooves along the horizontal direction at the first polycrystalline silicon layer, the sacrificial layer and the sidewall dielectric layer;
   (10) forming a second polycrystalline silicon layer on the first base dielectric layer and the second base dielectric layer;
   (11) forming a covering dielectric layer on the second polycrystalline silicon layer;
   (12) forming a coupled dielectric layer on the first polycrystalline silicon layer, the sidewall dielectric layer and the covering dielectric layer;
   (13) selectively forming a third polycrystalline silicon layer on the coupled dielectric layer;
   (14) defining a third pattern opening; and
   (15) performing a second ion implantation according to the third pattern opening.

2. The method for manufacturing a non-volatile memory unit as claimed in claim 1, wherein step (4) further comprises steps of:
   applying a photoresist, etching the sacrificial layer and the first polycrystalline silicon layer at a region outside the first pattern opening and the second pattern opening, thus forming the sacrificial layer on the first polycrystalline silicon layer, and a stacked separated sacrificial layer and the first polycrystalline silicon layer are separated along the horizontal direction.

3. The method for manufacturing a non-volatile memory unit as claimed in claim 1, wherein step (4) further comprises steps of:
   the first polycrystalline silicon further comprising a floating gate (FG) formed on the first base dielectric layer via the first pattern opening and the second pattern opening.

4. The method for manufacturing a non-volatile memory unit as claimed in claim 1, wherein step (6) further comprises steps of:
   via the second pattern opening, formed a thinned first base dielectric layer under the second pattern opening.

5. The method for manufacturing a non-volatile memory unit as claimed in claim 1, wherein step (6) further comprises steps of:
   forming a separator at each side of the sacrificial layer upon the second pattern opening, wherein the separators are electrically isolated.

6. The method for manufacturing a non-volatile memory unit as claimed in claim 5, wherein step (6) further comprises:
   forming a temporary sidewall dielectric layer at the sidewall of the first polycrystalline silicon layer, selectively thickening the first base dielectric layer and forming the temporary sidewall dielectric layer and the sidewall of the first polycrystalline silicon layer at the same time, connecting the first base dielectric layer.

7. The method for manufacturing a non-volatile memory unit as claimed in claim 6, wherein step (6) further comprises:
selectively changing the thickness of the first base dielectric layer, and removing the temporary sidewall dielectric layer formed at the sidewall of the first polycrystalline silicon layer.

8. The method for manufacturing a non-volatile memory unit as claimed in claim 1, wherein step (7) further comprises:
forming a temporary base dielectric layer at the second pattern opening at the substrate, and forming a trench above second pattern opening and between the temporary base dielectric layer and the sidewall dielectric layer.

9. The method for manufacturing a non-volatile memory unit as claimed in claim 1, wherein step (8) further comprises:
according to a mask defined by the second pattern opening, removing the temporary base dielectric layer at the second pattern opening.

10. The method for manufacturing a non-volatile memory unit as claimed in claim 1, wherein step (8) further comprises:
forming a separator at each side of the sidewall of the sacrificial layer at the second pattern opening, and the separators are electrically isolated.

11. The method for manufacturing a non-volatile memory unit as claimed in claim 1, wherein forming the second polycrystalline silicon layer of step (10) further comprises:
forming a fourth polycrystalline silicon layer, which with the second polycrystalline silicon layer both are formed in the damascene grooves, wherein the second polycrystalline silicon layer is formed in the damascene grooves of the first pattern opening and the fourth polycrystalline silicon layer is formed in the damascene grooves of the second pattern opening.

12. The method for manufacturing a non-volatile memory unit as claimed in claim 1, wherein step (11) further comprises:
removing the sacrificial layer according to the first and the second pattern openings, wherein the sacrificial layer outside first and the second pattern openings are removed.

13. The method for manufacturing a non-volatile memory unit as claimed in claim 1, wherein step (11) further comprises:
defining a region outside the third pattern opening as a mask; and
removing the first polycrystalline silicon layer outside the third pattern opening.

14. The method for manufacturing a non-volatile memory unit as claimed in claim 1, wherein a first dielectric layer is defined, and the first dielectric layer comprises the first and the second base dielectric layers formed on the substrate.

15. The method for manufacturing a non-volatile memory unit as claimed in claim 1, wherein a second dielectric layer is defined, the second dielectric layer comprises the sidewall dielectric layer is formed at two sides of the first polycrystalline silicon layer and the sacrificial layer, and the covering dielectric layer is formed on the second polycrystalline silicon layer, wherein the second dielectric layer covers an erase gate (EG) and a selective gate (SG).

16. A non-volatile memory unit comprising:
a substrate, wherein a source region and a drain region are formed on a surface, and the source region and the drain region are separated apart via a channel region;
a first dielectric layer, formed on the substrate and defining a first pattern opening along a depth direction of the first dielectric layer;
an erase gate (EG), formed on the first dielectric layer and is disposed upon a projection of the first pattern opening along the depth direction;
a floating gate (FG), formed on the first dielectric layer and near the erase gate;
a selective gate (SG), formed on the first dielectric layer and near the floating gate, wherein the selective gate and the floating gate are disposed upon a channel region's projection along the depth direction;
a second dielectric layer, formed on the first dielectric layer and covering the erase gate and the selective gate, wherein the floating gate is disposed between the erase gate and the selective gate;
a coupled dielectric layer, formed on the erase gate, the floating gate, the selective gate and the second dielectric layer; and
a couple control gate (CG), formed on the coupled dielectric layer;
wherein the first pattern opening of the first dielectric layer has a first thickness, a thickness of the first dielectric layer below a projection of the floating gate (FG) is defined as a second thickness, and a thickness of the first dielectric layer below a projection of the selective gate (SG) is defined as a third thickness,
wherein the first thickness is thicker than the second thickness, and the second thickness is thicker than the third thickness.

17. The non-volatile memory unit of claim 16, wherein the second dielectric layer is disposed two sides of the erase gate (EG) and the second dielectric layer is formed from two sides of the first pattern opening from a central of the erase gate (EG).

18. The non-volatile memory unit of claim 16, wherein the first dielectric layer has a second pattern opening, which is defined by the selective gate (SG) along the depth direction.

19. The non-volatile memory unit of claim 16, wherein the first dielectric layer has a third pattern opening, which is defined by the source region along the depth direction.

20. The non-volatile memory unit of claim 16, wherein the selective gate (SG) further comprises a separator formed above the second pattern opening at each side of the selective gate (SG), and the separator is electrically isolated.

21. The non-volatile memory unit of claim 16, wherein the erase gate (EG) and the selective gate (SG) are formed in a damascene grooves, and the floating gate (FG) and the second dielectric layer are disposed between the erase gate (EG) and the selective gate (SG).

22. The non-volatile memory unit of claim 16, wherein the second dielectric layer formed above the erase gate (EG) and the selective gate (SG) is covered by a covering dielectric layer, and the covering dielectric layer is parallel to the first dielectric layer.

* * * * *